(12) United States Patent
McCracken et al.

(10) Patent No.: US 9,946,312 B2
(45) Date of Patent: Apr. 17, 2018

(54) ARTICULATED SCREEN COVER FOR ACCOMMODATING OBJECTS

(71) Applicant: Microsoft Technology Licensing, LLC, Redmond, WA (US)

(72) Inventors: Ivan Andrew McCracken, Sammamish, WA (US); Hua Wang, Sammamish, WA (US); Karsten Aagaard, Monroe, WA (US); David Otto Whitt, III, Sammamish, WA (US); Robert James Bingham, Jr., Everett, WA (US); Ralf Groene, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/260,137

(22) Filed: Apr. 23, 2014

(65) Prior Publication Data

US 2015/0309544 A1 Oct. 29, 2015

(51) Int. Cl.
*G06F 1/16* (2006.01)
*G06F 1/18* (2006.01)
(Continued)

(52) U.S. Cl.
CPC ............ *G06F 1/182* (2013.01); *G06F 1/1626* (2013.01); *H05K 5/0086* (2013.01); (Continued)

(58) Field of Classification Search
CPC ........... G06F 2200/1634; G06F 1/1681; G06F 1/1669; G06F 1/1628; G06F 1/1603; G06F 1/1607; A45C 2011/003; A45C 13/002; Y10T 16/5401; H05K 5/0226; H05K 5/03; H05K 5/0239; B42F 13/406
USPC .......... 361/679.27, 679.28, 679.58; 206/320, 206/751; 345/156, 179; 335/219, 285; D14/345, 501
See application file for complete search history.

(56) References Cited

U.S. PATENT DOCUMENTS

| 5,796,575 A | 8/1998 | Podwalny et al. |
| 6,903,927 B2 | 6/2005 | Anlauff |

(Continued)

FOREIGN PATENT DOCUMENTS

WO 2013133810 A1 9/2013

OTHER PUBLICATIONS

Hill, Simon, "Show off your Google tablet with these 15 Nexus 7 Cases", Published on: Jan. 30, 2014, Available at: http://www.digitaltrends.com/mobile/best-nexus-7-cases/, 5 pages.

(Continued)

*Primary Examiner* — James Wu

(57) ABSTRACT

A cover for a mobile computing device includes two or more hinges so constructed that the hinges are substantially rigid when in-plane and flexible when out-of-plane. The cover includes segments made of a rigid material disposed between the hinges. The cover, when swiveled to the back side of the computing device, forms a contour around an object such as a stylus to secure the object to the back side of the computing device when the object is present. The cover becomes substantially flat and parallel to the back side of the computing device when the object is absent.

20 Claims, 13 Drawing Sheets

(51) Int. Cl.
  *H05K 5/00* (2006.01)
  *H05K 5/02* (2006.01)
  *A45C 13/00* (2006.01)
  *A45C 11/00* (2006.01)
(52) U.S. Cl.
  CPC ......... *H05K 5/0217* (2013.01); *H05K 5/0226* (2013.01); *A45C 13/002* (2013.01); *A45C 2011/003* (2013.01); *G06F 1/1628* (2013.01); *G06F 1/1669* (2013.01); *G06F 1/1681* (2013.01); *G06F 2200/1633* (2013.01); *G06F 2200/1634* (2013.01)

(56) References Cited

U.S. PATENT DOCUMENTS

| | | | |
|---|---|---|---|
| 7,054,441 B2 | 5/2006 | Pletikosa | |
| D658,187 S * | 4/2012 | Diebel | D14/440 |
| 8,253,518 B2 | 8/2012 | Lauder et al. | |
| 8,281,924 B2 * | 10/2012 | Westrup | A45C 3/02 206/320 |
| 8,474,609 B1 | 7/2013 | Hong et al. | |
| 8,498,100 B1 * | 7/2013 | Whitt, III | G06F 1/1618 361/679.17 |
| 8,665,045 B2 | 3/2014 | Lauder et al. | |
| 2008/0302687 A1 * | 12/2008 | Sirichai | A45F 5/02 206/320 |
| 2011/0228458 A1 | 9/2011 | Richardson et al. | |
| 2012/0194448 A1 * | 8/2012 | Rothkopf | A45C 13/002 345/173 |
| 2012/0211377 A1 | 8/2012 | Sajid | |
| 2013/0088431 A1 | 4/2013 | Ballagas et al. | |
| 2013/0140203 A1 * | 6/2013 | Chiang | G06F 1/1628 206/320 |
| 2013/0216740 A1 | 8/2013 | Russell-Clarke et al. | |
| 2013/0277271 A1 | 10/2013 | Toulotte | |

OTHER PUBLICATIONS

Hart, Brian, "Pelican's ProGear CE2180 Case for iPad Air: Nails wished they were this tough!", Published on: Feb. 18, 2014, Available at: http://www.examiner.com/review/pelican-s-progear-ce2180-case-for-ipad-air-nails-wished-they-were-this-tough, 3 pages.

"Slim & Sturdy iPad Smart Cover with Magnetic Aluminium Hinge", Retrieved on: Feb. 19, 2014, Available at: http://www.hulala.com.my/deal/ipad-smartcover-ict, 6 pages.

"International Search Report & Written Opinion Received for PCT Application No. PCT/US2015/025497", dated Oct. 27, 2015, 19 pages.

"Second Written Opinion Issued in PCT Application No. PCT/US2015/025497", dated Jun. 3, 2016, 8 pages.

Yao, et al., "PneUI", In Proceedings of the 26th Annual ACM Symposium on User Interface Software and Technology, Oct. 8, 2013, pp. 13-22.

"International Preliminary Report on Patentability Issued in PCT Application No. PCT/US2015/025497", dated Aug. 26, 2016, 9 Pages.

* cited by examiner

ARTICULATED SCREEN COVER FOR ACCOMMODATING OBJECTS

SUMMARY

Examples of the disclosure provide a cover for a computing device. The cover is articulated to an edge of the computing device. In one example, the cover includes at least three hinges disposed substantially parallel to the edge of the computing device, the three hinges comprising g a first hinge, a second hinge and a third hinge. Further, the cover comprises at least a first cover section, a second cover section and a third cover section. The first cover section and the second cover section are connected by a first hinge. The second cover and the third cover section are connected by a second hinge. The cover has a connector connected to the first cover section by the third hinge. The connector can be connected to the computing device so as to attach the cover to the computing device. The first cover section, the second cover section, the third cover section, and the three hinges are attached together such that the cover forms a contour to accommodate an object located on the back side of the computing device. Further, the cover becomes substantially flat and parallel to the back side of the computing device when the object is absent.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DETAILED DESCRIPTION

A tablet is a small footprint computing device characterized by a touch sensitive screen that often occupies all, or a significant portion of the front of the tablet. The touch sensitive screen receives input from a user and displays output to the user. The user provides input by touching the screen with, for example, a finger or a stylus. Many users use the stylus as a pen for taking electronic hand-written notes or making sketches using digital ink. While some tablets provide an embedded compartment or tether for retaining the stylus, the compartment or tether is designed only for the specific stylus type supplied with the tablet, and is not compatible with different kinds or types of styluses (or other input devices). In systems without the compartment or tether, the stylus is typically carried separately. This often results in a lost or misplaced stylus.

In some systems, the stylus has a clip to affix the stylus to the tablet or to a cover on the tablet. The cover protects the touch sensitive screen from damage. Existing covers are available in many designs, including rigid designs that act similar to a hardback book cover, and foldable designs that convert into a stand to support the tablet at a viewing angle. However, these covers fail to provide secure, internal storage for different types of styluses or other input devices.

Figure 4:
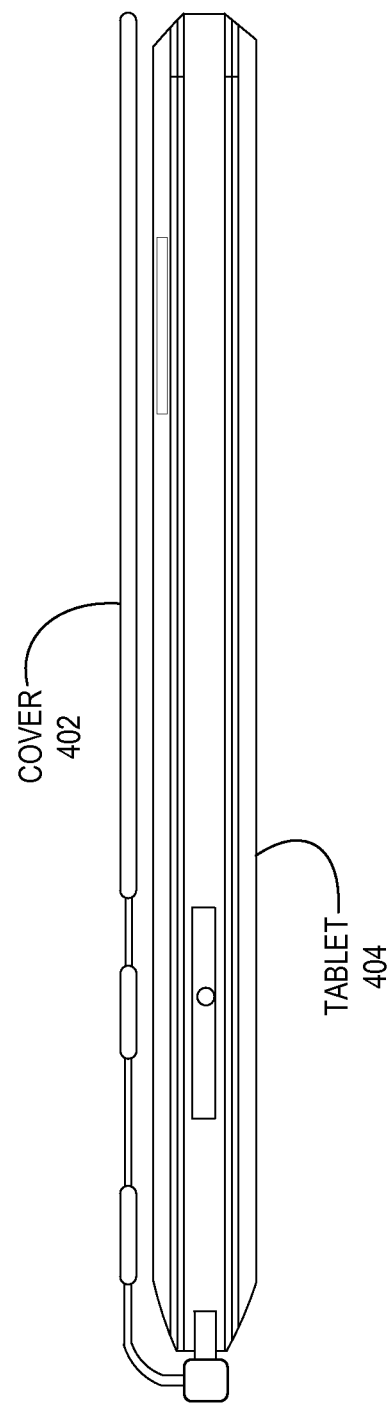
FIG. 4 is an exemplary schematic diagram illustrating general arrangement of an exemplary cover when folded over the touch screen of an exemplary tablet.
Figure 5A:
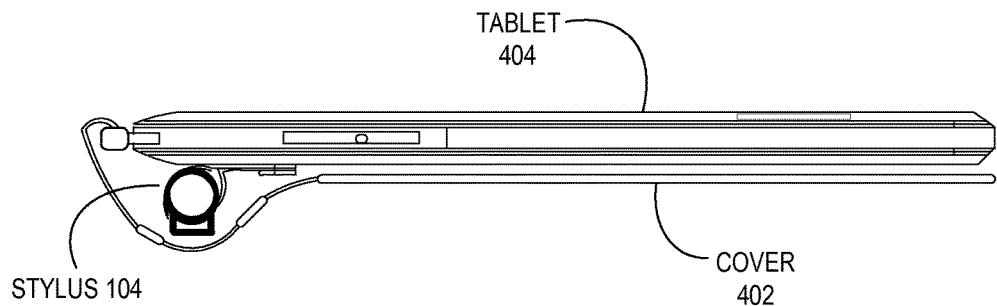
FIGS. 5A-5C are exemplary schematic diagrams illustrating various exemplary positions of exemplary cover while storing an exemplary stylus.
Figure 5B:
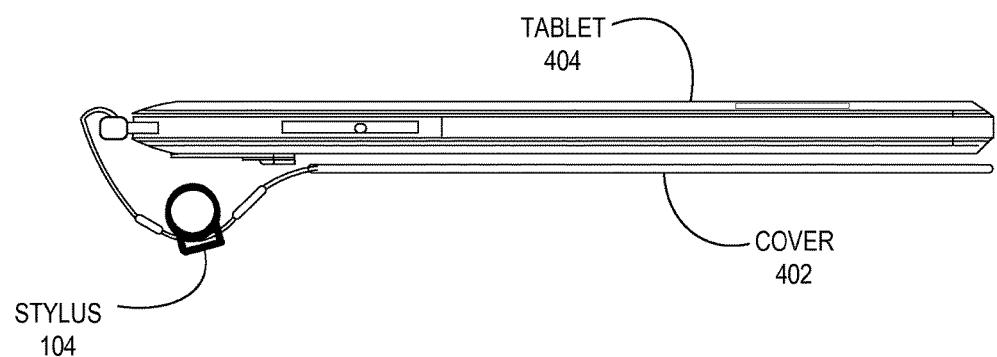
Figure 5C:
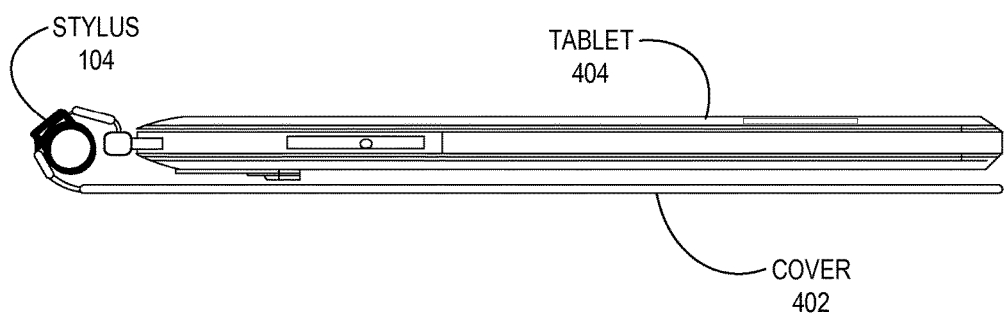

Referring to the figures, examples of the disclosure describe a cover for a tablet, or other device with a touch screen, that provides a secure space for conveniently stowing a stylus, pen, or other object on the tablet or cover while also providing protection to the touch screen of the tablet when the tablet is not in use. The cover is attached to the tablet and may swivel around the edge of the tablet, in some examples. Further, the cover may be positioned below, or under, the back side of the tablet as shown in FIGS. 5A-5C, for example, by forming a contour around a stylus or other object to store or otherwise accommodate the stylus or other object. The cover may also be positioned above the touch screen of the tablet as shown in FIG. 4, for example, to provide protection to the touch screen when the tablet is not in use. In some examples, the cover includes a three-piece hinged section that permits the stylus to be stored between the cover and the tablet.

Figure 3:
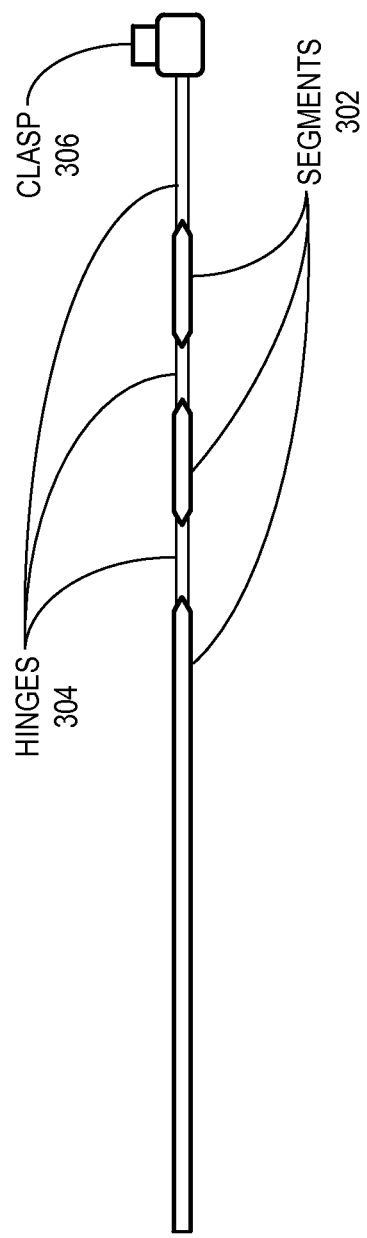
FIG. 3 is an exemplary schematic diagram illustrating a general arrangement of one example of a cover.

Aspects of the disclosure provide a cover having flexible, rigid, partially flexible, and/or partially rigid structural material with a clasp, such as schematically shown in FIG. 3. The clasp has a corresponding receptacle on the tablet to which the clasp may connect (e.g., snap in). Once mated with the tablet, the cover may take various positions relative to the tablet to meet the needs of a user. For example, when the tablet is not in use, the cover may be bent to assume a position above the touch sensitive screen. In this position, the cover protects the touch screen and buttons on the side of the touch screen as shown, for example, in FIG. 4. When the tablet is in use, the cover may be wrapped around the back of the tablet such that the flexible portions, acting as hinges, allow the cover to bend around the contours of the edge of the tablet. In this configuration of the cover, the stylus may be stored with the tablet by placing the stylus between the cover and tablet. The stylus is retained while the cover wraps around the tablet, such as shown in FIGS. 5A-5C. In some examples, the flexible portions of the cover act as detents as the cover articulates around the tablet.

Aspects of the disclosure provide protection to the touch screen and to buttons on the side of the touch screen while at the same time providing stowage for any kind of stylus, pen, or other object for use with the tablet. The cover, when folded over the touch screen, provides protection against scratches, dirt, dust, lotion, oil, liquid, and the like. Further, the cover provides protection against falls, abrasive force, and vibrations encountered at the touch screen side. In some examples, the cover, when folded over the touch screen, generally maintains a small gap between the surface of the cover and the surface of the touch screen. The flexible part of the cover is resilient and provides a degree of damping to any vibrations encountered. Further, when folded over the back side of the tablet, the cover provides protection to a rear camera and any other devices that are on the back side of the tablet. Further, the cover provides a handy and convenient method of storing the stylus on the tablet or cover itself without encumbering the user in the usage of the tablet.

Additionally, the cover provides a user-friendly means for storing the stylus or other objects with the tablet. Aspects of the disclosure provide a convenient means for stowing articles of various sizes and shapes, including any size and shape of stylus, pen, BLUETOOTH brand communication device (e.g., headsets, receiver, transmitter), USB storage device, audio split data cable, universal serial bus (USB) to micro USB adapter, and/or other accessory. The cover may also store more than one object with the cover. The cover, once mated with the tablet, may be wrapped around the back of the tablet and may store the object because the flexible hinges of the cover are wrapped around the object, thus securing the object. The cover, while providing a means for storing the object or other accessory, may be configured to take a position on the back side of the tablet substantially flat and parallel to the back side.

Figure 1:
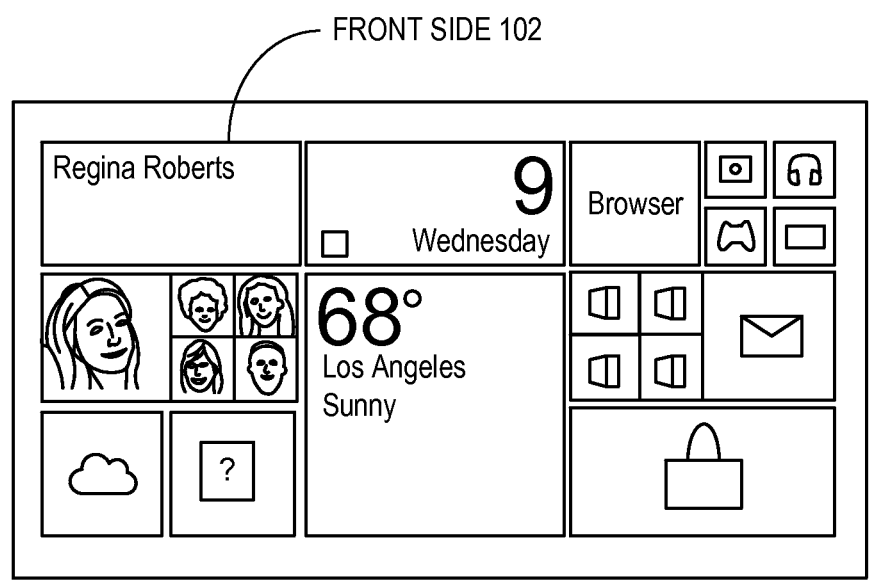
FIG. 1 is an exemplary schematic diagram illustrating a front view of an exemplary tablet and exemplary styluses used for handwriting and/or sketching on the surface of the touch screen.
Figure 1:
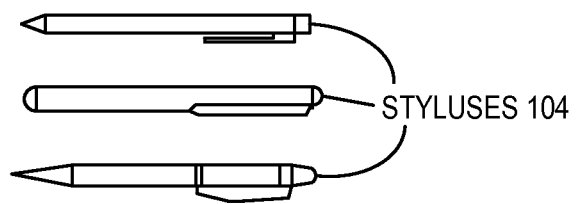
Figure 2:
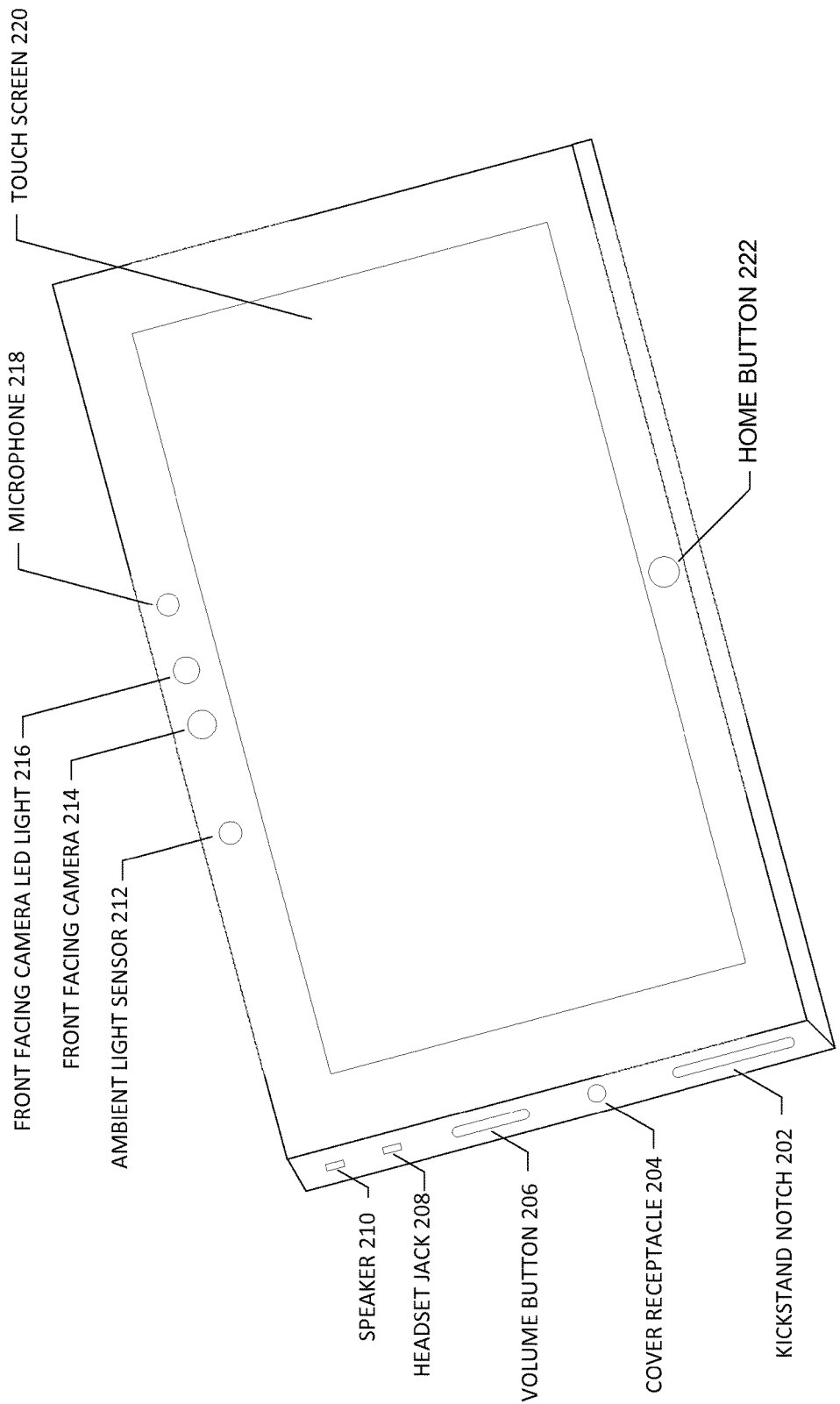
FIG. 2 is an exemplary schematic diagram illustrating an exemplary front side of a tablet with buttons, ports, and input/output components.

Referring to FIG. 1, an exemplary schematic diagram illustrates a front side 102 of an exemplary tablet 404 with a few exemplary styluses 104 that may be used for handwriting and sketching or painting. While taking notes with a stylus 104 on a touch screen 220 (e.g., as shown in FIG. 2), different types of styluses 104 or pens may be used. For example, if an already displayed document is to be marked, a pointed stylus 104 may be used. For taking notes, a less pointed stylus 104 may be used. For sketching, a stylus with a thicker end, such as that of a pen, may be used. For drawing, a paint brush-like stylus may be used. Aspects of the disclosure provide for stowing styluses 104 and other accessories of various shapes and sizes with the tablet 404 itself, enabling the accessories to be readily available for use when desired.

While described with reference to a tablet such as the tablet 404 as shown in FIG. 4, aspects of the disclosure are operable with any kind of device having a screen. Exemplary devices include, but are not limited to, various mobile computing devices such as mobile phones, personal digital assistants, hand-held computing devices, pocket translators, e-books, bar code readers, laptops, smart phones, phablets, phonepad or padphone, computing pads, gaming devices, portable media players, digital cameras, and the like. Exemplary devices also include less portable devices such as tabletop devices, kiosks, and industrial control devices.

Referring next to FIG. 2, an exemplary schematic diagram illustrates an isometric view of an exemplary tablet 404. The isometric view shows the touch screen 220, various exemplary buttons on the front side 102, and components and ports width-wise on one side of the tablet 404. The exemplary buttons and components on the front side 102 include an ambient light sensor 212, a front facing camera 214, a front facing camera light emitting diode (LED) light 216, a microphone 218, the touch screen 220, and a home button 222. Width-wise components include a kickstand notch 202, a cover receptacle 204, a volume button 206, a headset jack 208 and a speaker 210. A clasp 306 of a cover 402 may be releasably coupled to cover receptacle 204 without any additional fasteners. Various means of the coupling of clasp 306 and cover receptacle 204 may be used to provide not only mechanical coupling, but also electrical coupling in some examples.

FIG. 3 shows an exemplary overall view of the cover 402 with its exemplary parts. The cover 402 may be made from various materials and may comprise a suitable number of segments 302 such that the cover 402 has adequate balance between rigidity and flexibility to bend by about 360 degrees both in the clockwise and reverse clockwise directions without suffering any cracks, fissures or fractures, and remain mechanically stable after bending. The ability to bend in either direction and then remain mechanically stable is imparted by a combination of segments 302 and hinges 304. The hinges 304 are composed of a material, and/or use a structure, that imparts rigidity in-plane and flexibility out-of-plane. In one example, this construction is achieved by producing ribs in the hinges 304 using a material (e.g., polyester resin) when constructing the hinges 304. In an example such as shown in FIG. 3, the cover 402 is composed of segments 302, hinges 304, and the clasp 306 that may be attached to the cover receptacle 204 of the tablet 404. While FIG. 3 depicts three sections of segment 302 and three hinges 304, various other examples may have more or less than three segments 302, and more or less than three hinges 304.

In one example, the segments 302 include the first cover section, the second cover section and the third cover section as described herein. For example, the first cover section and the second cover section have a first width, and the third cover section may have a second width. Alternatively, the first cover section may have the first width, the second cover section may have the second width, and the third cover section may have a third width. In some examples, the first width, the second width, and the third width each may have a different value. In some other examples, any two of the first width, the second width, and the third width may have the same value. For example, the first width and the second width may each be less than two-thirds of the third width.

In one example, the value of the first width may be less than the value of the second width. For example, the first width may be less than two-thirds less of the second width. In another example, the second cover section may have the third width whose value may he less than the value of the first width. Accordingly, in different examples, the first cover section, the second cover section, and the third cover section may have any combination of the first width, the second width, and the third width. Further, each of the first width, the second width, and the third width may have any value relative to another. In some examples, any one, two, or all of the first cover section, the second cover section and the third cover section may have a fourth width whose value may be greater than, equal to, or less than each of the values of the first width, the second width, and the third width. For example, the fourth width is two-thirds greater than each of the first width, the second width, and the third width.

In some examples, the hinges 304 include the first hinge, the second hinge, and the third hinge as described herein. In an example, the first hinge and the second hinge have the third width whose value may be less than the value of the first width.

In one example, the cover may have a fourth cover section and a fourth hinge (not shown in FIG. 3). In such an example, the fourth cover section may be connected to the third cover section by the fourth hinge. In this example, the fourth cover section may have the second width. The first, the second, and the third cover sections may have the first width, while the value of the first width is different from the value of the second width. For example, the first width may be less than two-thirds of the second width.

The hinges 304 provide articulation between the segments 302 thus imparting the cover 402 with an ability to conform to the contours of the stylus 104 in the stored position on the back side of the tablet 404 while enabling the user to hold and use the tablet 404 without removing the cover 402 or repositioning the stylus 104. Different shapes and sizes of styluses 104 may be stored on the tablet 404 using the cover 402. In some examples, the cover 402 is so constructed that it may store more than one object. For example, there may be two sets of the hinges 304 such that two separate objects may be secured to the back side of the tablet 404 by the cover 402.

When the tablet 404 is not in use, the cover 402 may be rotated around an edge of the tablet 404 in the direction of the touch screen 220 and positioned above the touch screen 220 so that the cover 402 covers the touch screen 220 with a pre-determined gap between the touch screen 220 and the cover 402 as shown, for example, in FIG. 4.

In some examples, at least one of the segments 302 may have a magnet 802 embedded or otherwise affixed to it. For example, the tablet 404 may have a Hall effect sensor in the front side 102, while the cover 402 has a magnet 802. When the cover 402 is folded over the touch screen 220, the magnet 802 in the cover 402 may interact with the Hall effect sensor and signal the tablet 404 to transition to sleep mode. A predetermined gap (e.g., two millimeters) between the tablet 404 and the cover 402 provides adequate protection to the touch screen 220 while ensuring that the magnetic field of magnet 802 in the cover 402 is close enough to trigger the Hall effect sensor. Additionally, the gap performs a shock-absorbing function such that shocks not exceeding a threshold value cause the cover 402 to flex about the hinges 304 to absorb the shocks without damage.

Figure 6:
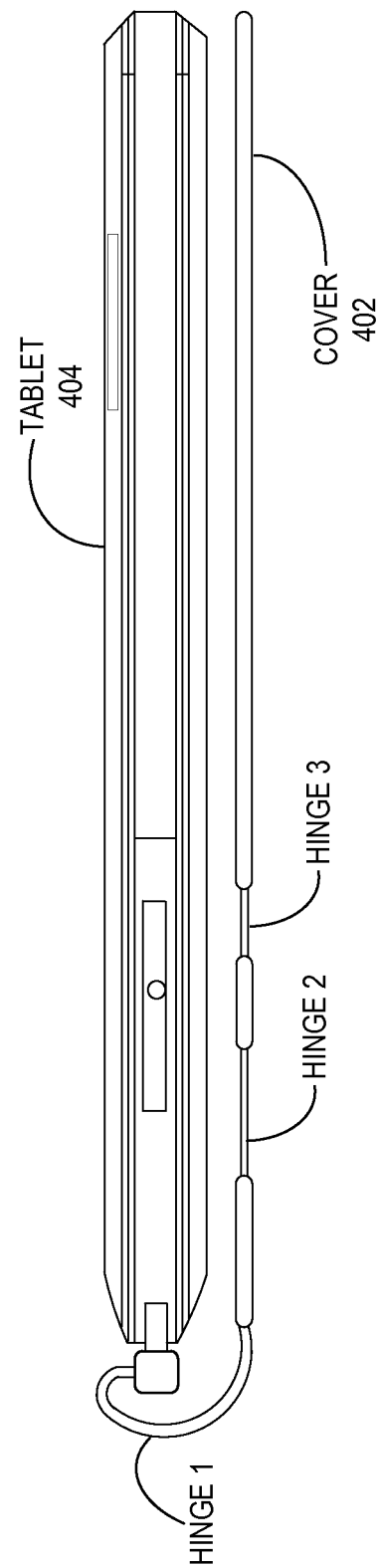
FIG. 6 is an exemplary schematic diagram illustrating a configuration of the cover when wrapped around the tablet on the hack side without any object being stored.

The cover 402 may be wrapped around the back side of the tablet 404 even when there is no stylus 104 or any other object stored on the tablet 404 as shown, for example, in FIG. 6. In this position at least one of the hinges 304 (e.g., hinge 1 as shown in FIG. 6) may be bent while the other hinges 304 (e.g., hinge 2 and hinge 3) may remain straight and within plane to remain substantially rigid, in some examples. Therefore, the cover 402 stays flat and substantially parallel to the back side of the tablet 404 even when there is no object stored therein. The cover 402 thus provides an easy mechanism for holding and using the tablet 404 whenever the cover 402 is wrapped around the back side of the tablet 404 irrespective of whether there is any object stored therein. In some examples, there is a gap between the back side of the tablet 404 and the cover 402 when the cover 402 is wrapped around the back side of the tablet 404. However, in other examples, there may not be any gap.

The clasp 306 enables releasable coupling between the tablet 404 and the cover 402. The clasp 306 is attached with the cover receptacle 204 by pressing the clasp 306 into the cover receptacle 204 such that the clasp 306 snaps in, in some examples. Alternatively, the clasp 306 may be magnetically attached to the cover receptacle 204. In such examples, both the clasp 306 and the cover receptacle 204 may contain magnetic components such that when brought close to each other, the clasp 306 snaps into the cover receptacle 204 in a pre-determined alignment position. Any other mechanism for attaching the clasp 306 to the cover receptacle 204 may be used including, for example, buttons, snaps, zippers, and/or hook-and-loop fasteners.

In some examples, one or more electrically conducting wires may run along at least a portion of the length of the cover 402. In such examples, the coupling between the clasp 306 and the cover receptacle 204 is both mechanical and electrical. For example, the cover 402 may have intelligent electrical circuitry and sensors to sense the direction of movement and the current configuration and/or orientation of the cover 402. For example, the intelligent circuitry and the sensors determine whether the cover 402 is being moved from beneath the back side (e.g., open position) towards the touch screen 220 (e.g., closed position) or vice versa. Alternatively or in addition, the circuitry and sensors determine the presence or the absence of any object within the cover 402. Information relating to the presence or absence of the object is sent to the tablet 404. The tablet 404 provides electrical signals, through the conducting wires, to make at least some of the hinges 304 rigid when no object is stored within the cover 402 and make at least some of the hinges 304 flexible when an object is stored therein. Electrical coupling between the clasp 306 and the cover receptacle 204 may also provide a channel for transmitting data between the cover 402 and a device, such as a tablet or smartphone. This data may represent sensed touch input on the cover 402 or signals to control and/or power displays, lights (e.g., light emitting diodes), sensors, or other electrical devices in the cover 402 or device.

Figure 7:
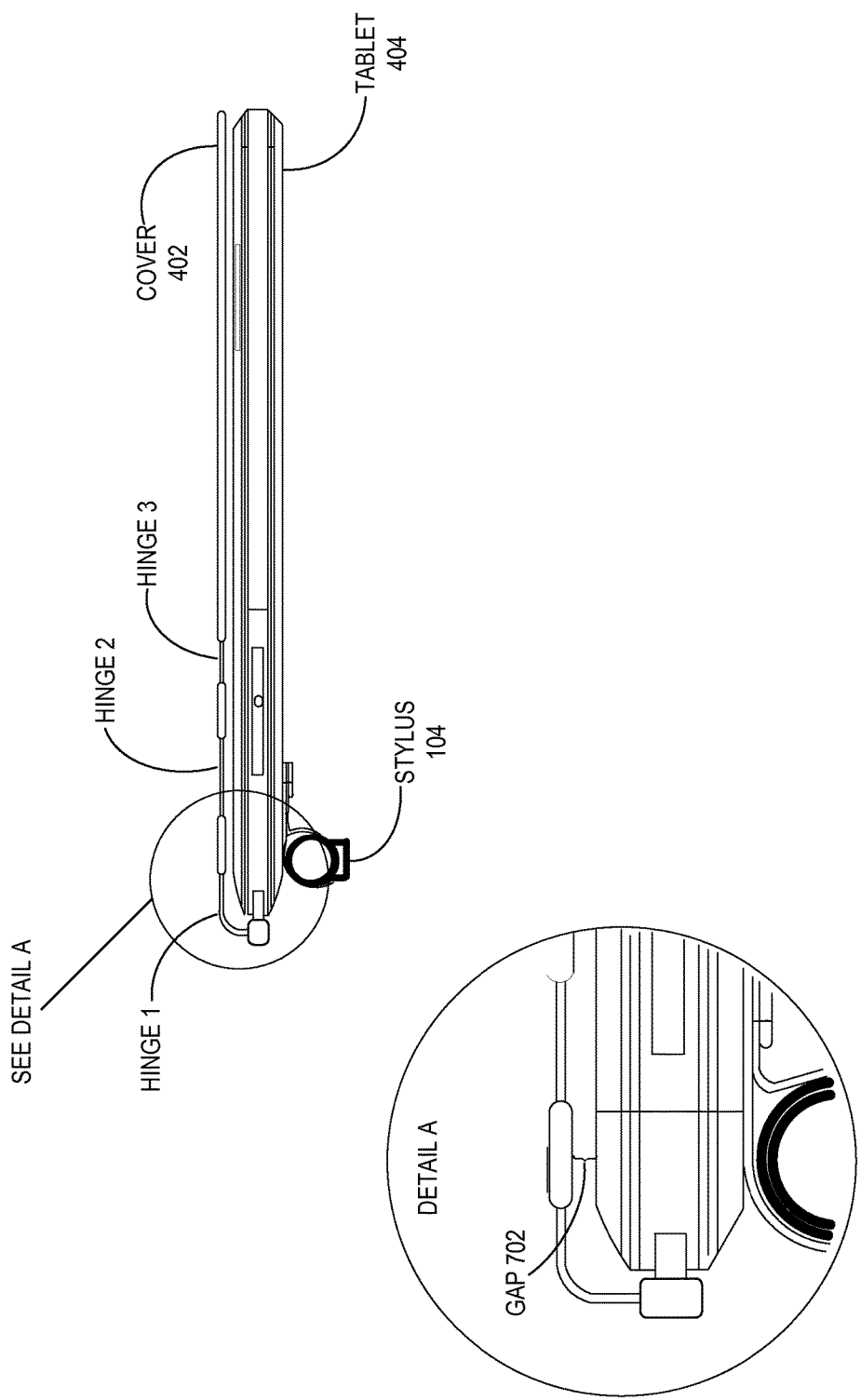
FIG. 7 is an exemplary schematic diagram illustrating a gap between the cover and the front side of the tablet when the cover is folded around the tablet on the front side.

Further, the intelligent circuitry and the sensors, in conjunction with the tablet 404 and the wires, may control the sequence of articulation of the hinges. While in some examples all the hinges 304 may bend to accommodate the object, the hinges 304 may bend in sequence in other examples. For example, hinge 1 (e.g., as shown in FIGS. 6 and 7) bends first, hinge 2 subsequently bends (during or after hinge 1 has completed bending) if the curvature being provided by hinge 1 is not adequate to accommodate the object, hinge 3 subsequently bends, and so on. The sequence and the extent of bending by each hinge 304 may be controlled by the wires based on the received signals. In general, the tablet 404 may send a signal to the cover 402 to cause the hinges 304 to articulate one at a time, two at a time, simultaneously, sequenced, and the like.

In one example, the intelligent circuitry and the sensors may comprise a microelectromechanical system (MEMS) enabling communicating between the tablet 404 and the cover 402 to alter the conditions of the hinges 304 based on the configuration of the cover 402. The intelligent circuitry and/or the sensors may also implement near-field communication (NEC) to convey the signals. BLUETOOTH brand communication modules may also be employed to implement the intelligent circuitry and/or the sensors in the tablet 404 and/or the cover 402.

Alternatively or in addition, the Hall effect sensor detects a changing magnetic field strength when the cover 402 is being moved from a closed position to an open position and vice versa. Accordingly, the direction of movement and the current position of the cover 402 may be detected. Based on such sensing, the tablet 404 may provide signals to the cover 402 to cause changes in the characteristics of the hinges 304 and the state of the embedded wires to match the current configuration and/or position of the cover 402. Hence, the tablet 404 may cause changes in the flexibility of the hinges 304 and the tension of the wires thus allowing the cover 402 to swivel around the edge of the tablet 404 and form a contour around the stylus (if present). Once positioned correctly, that position may be maintained by again modifying the state of the embedded wires and the flexibility of the hinges 304 to cause rigidity of the hinges 304 in the changed configuration.

Referring to FIG. 4, an exemplary configuration of the cover 402 is shown when the cover 402 is positioned above the touch screen 220 to protect the touch screen 220 when the tablet 404 is not being used.

FIGS. 5A-5C illustrate three different exemplary configurations of the cover 402 when the cover 402 is wrapped around an edge of the tablet 404 to occupy a position under the back side of the tablet 404. FIG. 5A shows the configuration when the stylus 104 is supported by the kickstand and the cover 402 is wrapped around the back side.

FIG. 5B illustrates a configuration in which the stylus 104 is being supported by the cover 402 under the back side of tablet 404 without any other support. In this configuration, the cover 402 may cradle the stylus, which may be held in place with respect to cover 402 with a clip. Alternatively, cover 402 may include a loop, slot, or other feature integrated into the cover material that may secure the stylus. The portion of cover 402 not cradling the stylus, in this configuration, lies substantially flat and parallel to the back side of the tablet 404.

The cover 402 may also have a pocket, loop, slot, or other feature, on a side of the cover 402, to hold a pen, paper, portable storage device (e.g., thumb drive), or other objects.

FIG. 5C illustrates a configuration in which the stylus 104 is being supported by the cover 402 laterally on a side edge of the tablet 404. The portion of cover 402 not wrapping around the stylus, in this configuration, lies substantially flat and parallel to the back side of the tablet 404.

The advantages of the cover 402 depicted in FIGS. 5A-5C are that the cover 402 provides several alternatives for stowing the stylus. In one example, the cover 402 includes greater than three flexible portions to act as hinges, thereby enabling the stowage of the stylus on the short edge of the tablet 404 and in one or more locations on the backside of the tablet 404. This may provide the benefit of multiple stylus stowage configurations that may be selected based on user preference. The cover 402 facilitates a comfortable holding posture of the tablet 404 and easy usage while at the same time provisioning a space for stowage of the stylus 104 and similar objects.

FIG. 6 is an exemplary schematic diagram illustrating a configuration of the cover 402 when the cover 402 occupies a position below the back side of the tablet 404 without cradling any object. As shown in FIG. 6, one of the hinges 304 (e.g., hinge 1) may assume a curved configuration while the other hinges 304 (e.g., hinge 2 and hinge 3) may remain straight and in-plane thus remaining substantially rigid. This enables the cover 402 to lie flat and substantially parallel to the back side of the tablet 404. While in some examples there may be a gap between the back side and the cover 402, in other examples the cover 402 may contact the back side.

FIG. 7 is an exemplary schematic diagram illustrating a configuration of the cover 402 folded onto the front side 102 of the tablet 404 and thereby providing protection to the touch screen 220. The cover 402 occupies a position substantially flat and parallel to the front side 102. Based on the materials selected for the flexible portions of the cover 402, a gap 702 may be present. In one exemplary example, the gap 702 may be 2 mm where the material selected comprises Mylar or a flexible plastic. In one example, gap 702 is reduced to as close to zero as possible using polyethylene terephthalate (PET) film so that the cover 402 rests flat on tablet 404. The material and design of cover 402 may be selected to minimize gap 702 so that it is small enough to provide protection to the touch screen 220 from ingress of dirt, dust, moisture, other foreign matters, and scratches.

Figure 8:
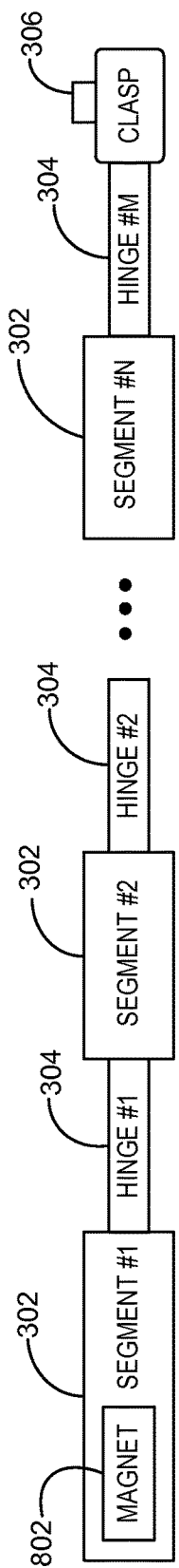
FIG. 8 is an exemplary schematic diagram illustrating the construction of the cover using a quantity of segments and hinges.

FIG. 8 is an exemplary schematic diagram illustrating an exemplary construction of the cover 402. In one example, the cover 402 has a plurality of segments 302 (e.g., segment 1 to segment N), a plurality of hinges 304 (e.g., hinge 1 to hinge M) and a clasp 306. In one example, at least one of the segments 302 (e.g., segment 1) may have the magnet 802 embedded or otherwise attached to it. The segments 302 are attached to hinges 304. For example, glue or another adhesive may be used for bonding the segments 302 and the hinges 304 together. In another example, the hinges 304 may be bonded to the segments 302 when the hinges 304 are in a semi-solid state and the segments 302 may be pressed and bonded to the hinges 304, the bond being formed on solidification of the hinges 304. Other methods of bonding between the segments 302 and hinges 304 may be used.

In some examples, one or more of the segments 302 and/or the hinges 304 are of different shapes and/or sizes. Further, the spacing between the hinges 304 may depend on the size of the object to be accommodated by the cover 402. For example, the spacing between the hinges 304 may be larger to accommodate larger objects, or smaller in other examples to accommodate smaller objects. Further, the quantities and sizes of the segments 302 and the hinges 304 are also a function of the size and/or shape of the object to be accommodated (e.g., cylindrical, rectangular, triangular, etc.). The shape, size, and/or spacing of the segments 302 and the hinges 304 also depend on the characteristics (e.g., shape, size, etc.) of the tablet 404 for which the cover 402 is designed. In some examples, at least two hinges 304 with a spacing therebetween are used. An exemplary spacing for the two-hinge example is 3±0.5 millimeters. In other examples, three hinges 304 are used with a spacing therebetween. An exemplary spacing for the three-hinge example is 7.5±0.5 millimeters.

In some examples, the segments 302 are made of rigid structural material such as glass-reinforced epoxy laminate (GRP) sheets of suitable thickness. In an exemplary example, the thickness of the segments 302 may be 2±0.2 millimeters after fabric is applied to cover the segments 302. Further, the GRP may be fire-retardant conforming to National Electrical Manufacturing Association (NEMA) FR-4 grade, or US Military specification MIL-I-24768/27. In other examples, other reinforcing materials such as paper, canvas, linen may be used, and any suitable thermo-setting resin may be used for construction of sheets to fabricate the segments 302. Various other materials for fabricating the segments 302 to have the desired characteristics (e.g., rigidity, temperature stability, durability, resistance to de-lamination) are also contemplated.

In an exemplary example, the hinges 304 are made of polyethylene terephthalate (PET) film. The thickness of the hinges 304 may range between 0.075-0.125 millimeters, in some examples. At least one example may use hinges having a thickness of 0.125±10% millimeters. In other examples, polyurethane, polycarbonate, or metal films may be used for construction of the hinges 304. Various other materials for fabricating the hinges 304 to have the desired characteristics (e.g., flexibility when out of plane and rigidity when in plane, temperature stability, malleability, ductility, durability) may be used.

In some examples, the segments 302 and the hinges 304 are wrapped with a continuous piece of fabric with adhesive to form the cover 402. In other examples, the cover may be formed by one piece of a continuous fabric without seams functioning essentially as a single hinge. In some examples, the fabric is composed of microfiber made of polyesters, polyamides or similar plastic material.

Further, the cover 402 may be formed with a single piece of continuous flexible film that is stiffened in portions to form the segments 302. In such examples, the unstiffened portions remain flexible to act as the hinges 304, while the stiffened portions act as the segments 302. Aspects of the disclosure are operable with any form or type of stiffener, such as acrylic polymer, latex, polyester, and more.

The hinges 304, while substantially rigid when straight and in plane, are amenable to bending in a near semi-circular shape when subjected to a force normal to the device and applied at the edge of the larger non-flexible segment as if being held in the hand. This force is approximately 10 Newtons while remaining within the elastic deformation range. The thickness, spacing, and the number of hinges 304 may be chosen based on the shape and size of the object to be accommodated, and/or the shape, size and contours of the edge of the tablet 404 along which the cover 402 may swivel when being positioned on the back side of the tablet 404 and accommodating objects such as the stylus 104.

Figure 9:
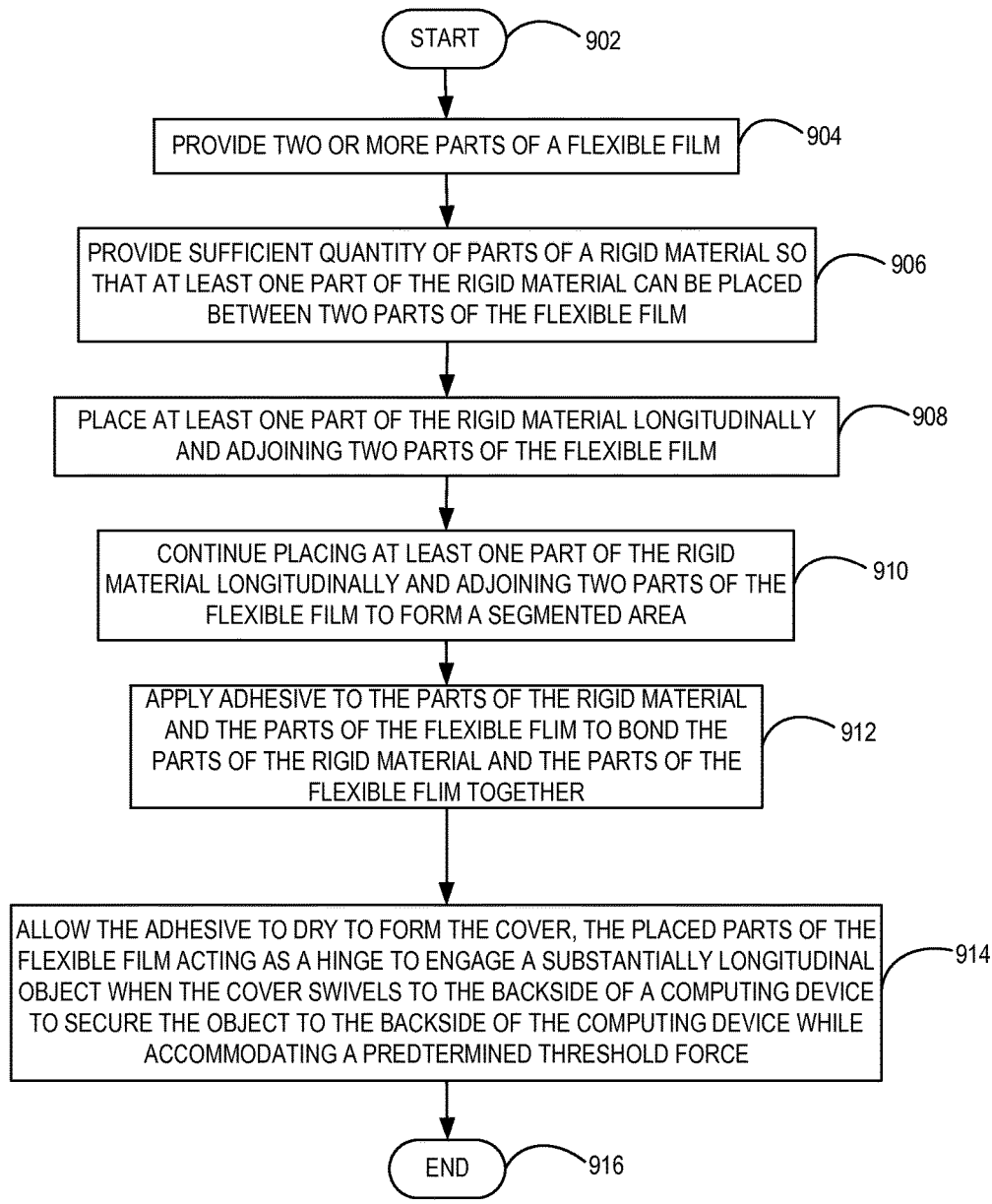
FIG. 9 is an exemplary flowchart illustrating a method of assembling the cover for the tablet.
Figure 10:
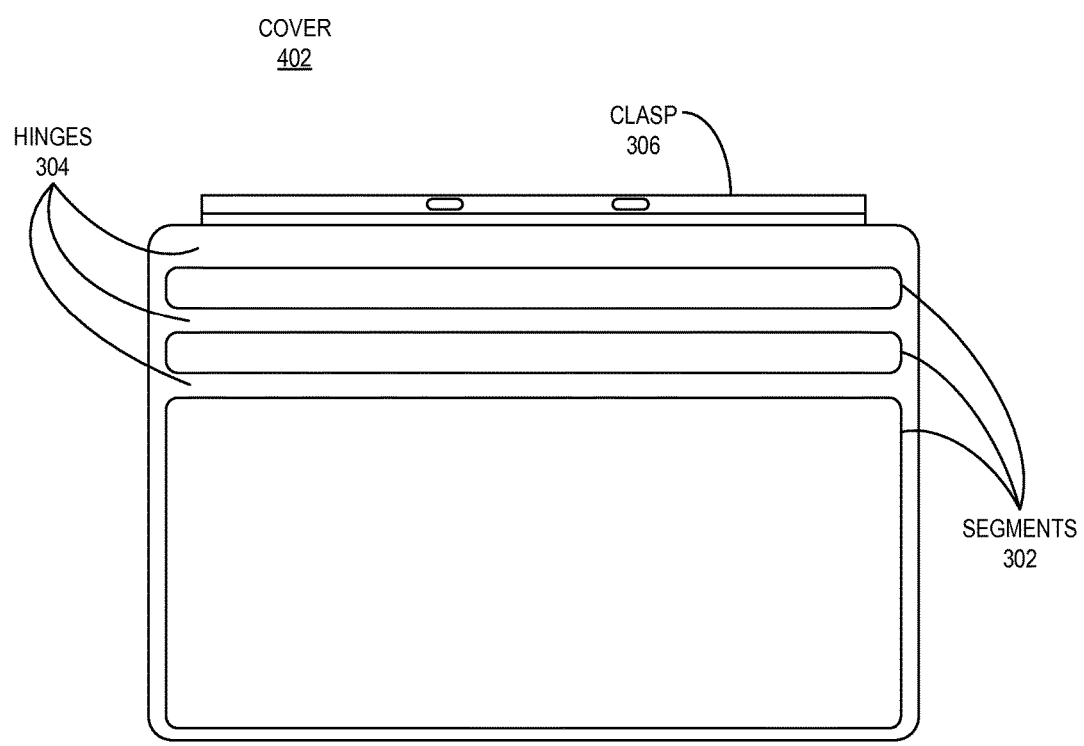
FIG. 10 is an exemplary schematic diagram illustrating flexible film hinges interspersed with rigid material to form the cover.

FIG. 9 illustrates an exemplary method of assembling a cover 402 for a computing device using parts of a flexible film (e.g., a PET film) or other material and a rigid material (e.g., a GRP sheet). FIG. 10 illustrates an exemplary cover 402 assembled using the method of FIG. 9. In particular, FIG. 10 illustrates flexible film hinges interspersed with rigid material to form the cover.

At 902, the process of assembly begins. At 904, two or more portions of a flexible film are provided. At 906, a sufficient quantity of portions of a rigid material is provided such that one part of a rigid material may be placed between two parts of the flexible film. At 908, one part of the rigid material is longitudinally placed between two parts of the flexible film such that all the parts are adjoining each other such as illustrated in FIG. 10. At 910, the process of operation 908 continues to form a segmented area (e.g., until all the parts are used) thus forming a chain of alternating parts of the flexible film and the rigid material longitudinally aligned. At 912, glue is applied to each part of the flexible film and the rigid material to bond each part of the flexible film and the rigid material together. At 914, the applied adhesive is allowed to dry so that all the parts of the flexible film and the rigid material placed adjoining each other at 910 are bonded together to form the cover 402 and the parts of the flexible film act as hinges 304. Alternatively or in addition, all the parts of the flexible film and the rigid material placed adjoining each other at 910 are wrapped with a continuous piece of fabric (e.g., a microfiber fabric) to form the cover 402 and the parts of the flexible film act as hinges 304. The cover 402 so formed may swivel to the back side of the computing device, such that at least one of the parts of the flexible film acts as a hinge 304 engaging a substantially longitudinal object (e.g., the stylus 104) to secure the object to the back side of the computing device. The hinges 304 further provide a force against the object to support the object in its secured position. At 916, the process of assembly ends. In examples in which the cover 402 has two hinges 304, the two hinges 304 form a wedge shape around the stylus 104. In examples in which the cover 402 has more than two hinges 304, the hinges 304 form a more semicircular shape around the stylus 104.

Figure 11A:
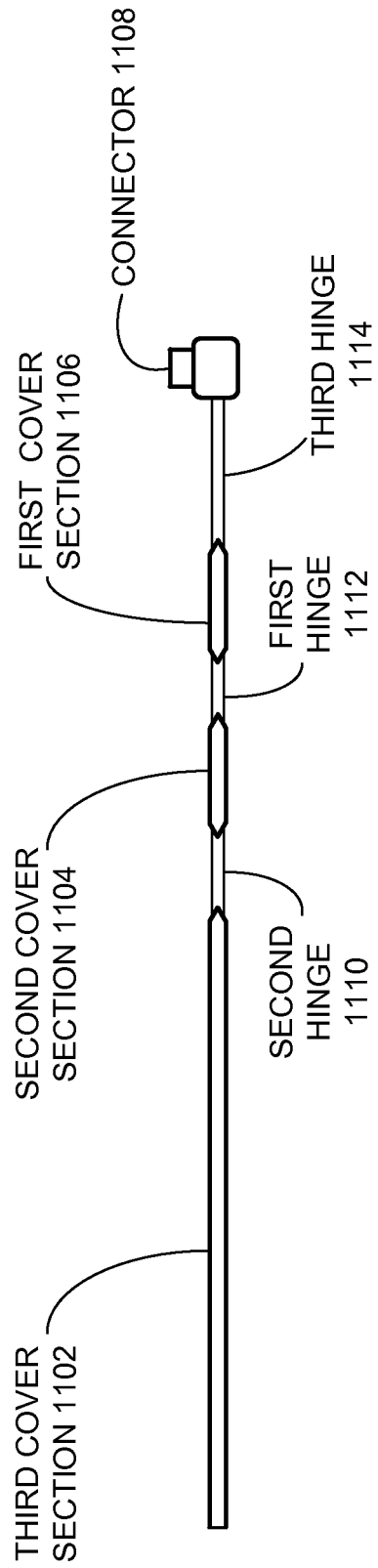
FIGS. 11A-11B are exemplary schematic diagrams illustrating an example cover construction having cover sections and hinges.
Figure 11B:
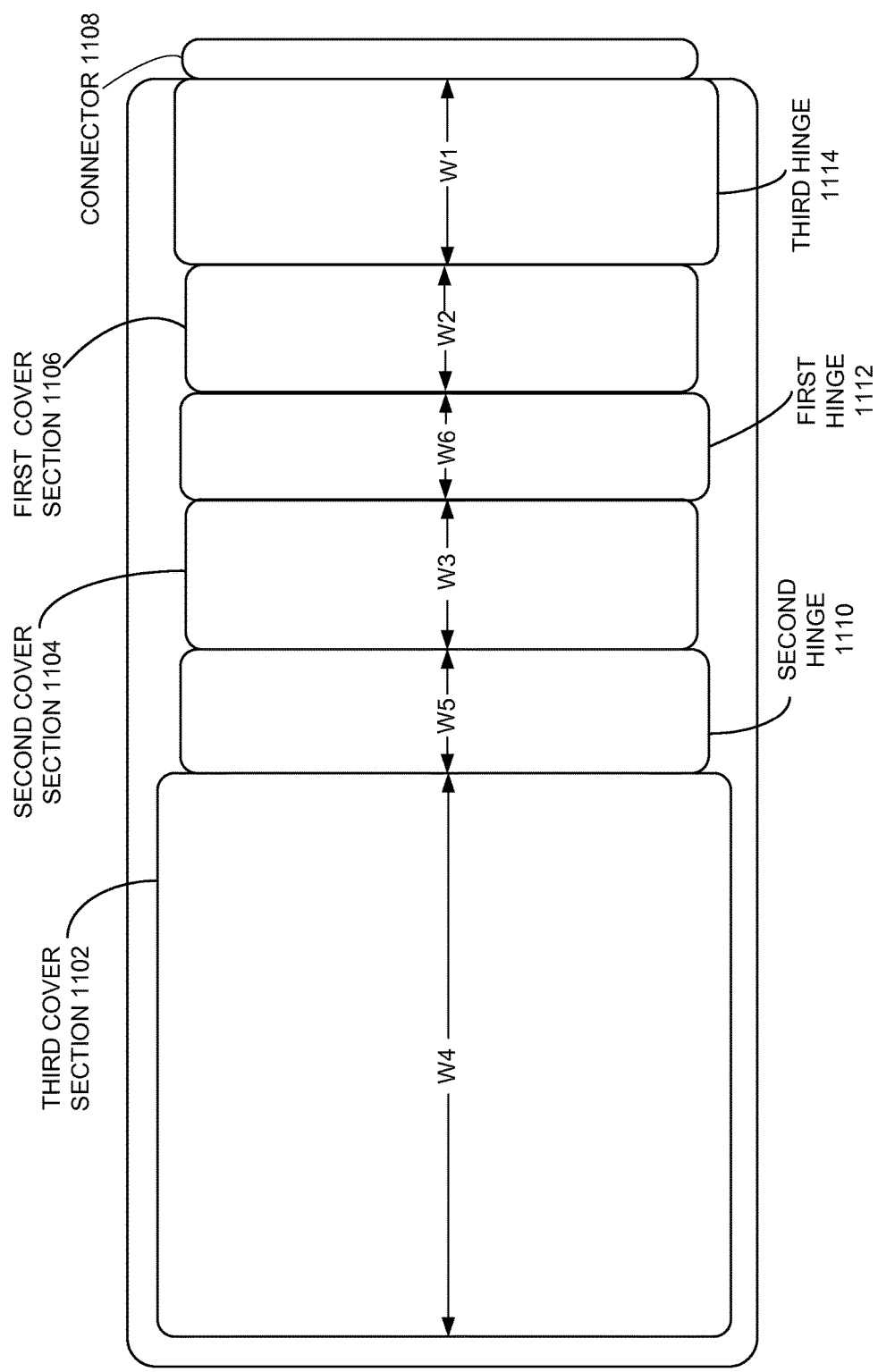

Referring to FIGS. 11A and 11B the portions of the cover 402 are shown. In this example, the cover 402 includes a connector 1108, a third hinge 1114, a first cover section 1106, a first hinge 1112, a second cover section 1104, a second hinge 1110, and a third cover section 1102. The first cover section 1106 may have a width W2, the second cover section 1104 may have a width W3, and the third cover section 1102 may have a width W4. The first hinge 1112 may have a width W6, the second hinge 1110 may have a width W5, and the third hinge 1114 may have a width W1. In an example, the width W1 of the third hinge 1114 may be greater than the width W2 of the first cover section 1106. In some examples, the width W3 of the second cover section 1104 may be less than the width W1 of the third hinge 1114. In one example, the width W4 of the third cover section 1102 may be greater than each of the widths W1, W2, and W3 of the third hinge 1114, the first cover section 1106, and the second cover section 1104 respectively (e.g., the third cover section 1102 may be at least two thirds greater than each of the third hinge 1114, the first cover section 1106, and the second cover section 1104). The widths W6 of the first hinge 1112 and W5 of the second hinge 1110 may be equal to, greater than, or less than the width W1 of the third hinge 1114. In some examples, the relationships between the widths of the hinges and cover sections may bear any relationship with each other (e.g., the width W4 of the third cover section may be two-thirds greater than any of the widths W1, W2, and W3 of the third hinge 1114, the first cover section 1106, and the second cover section 1104 respectively).

Figure 12:
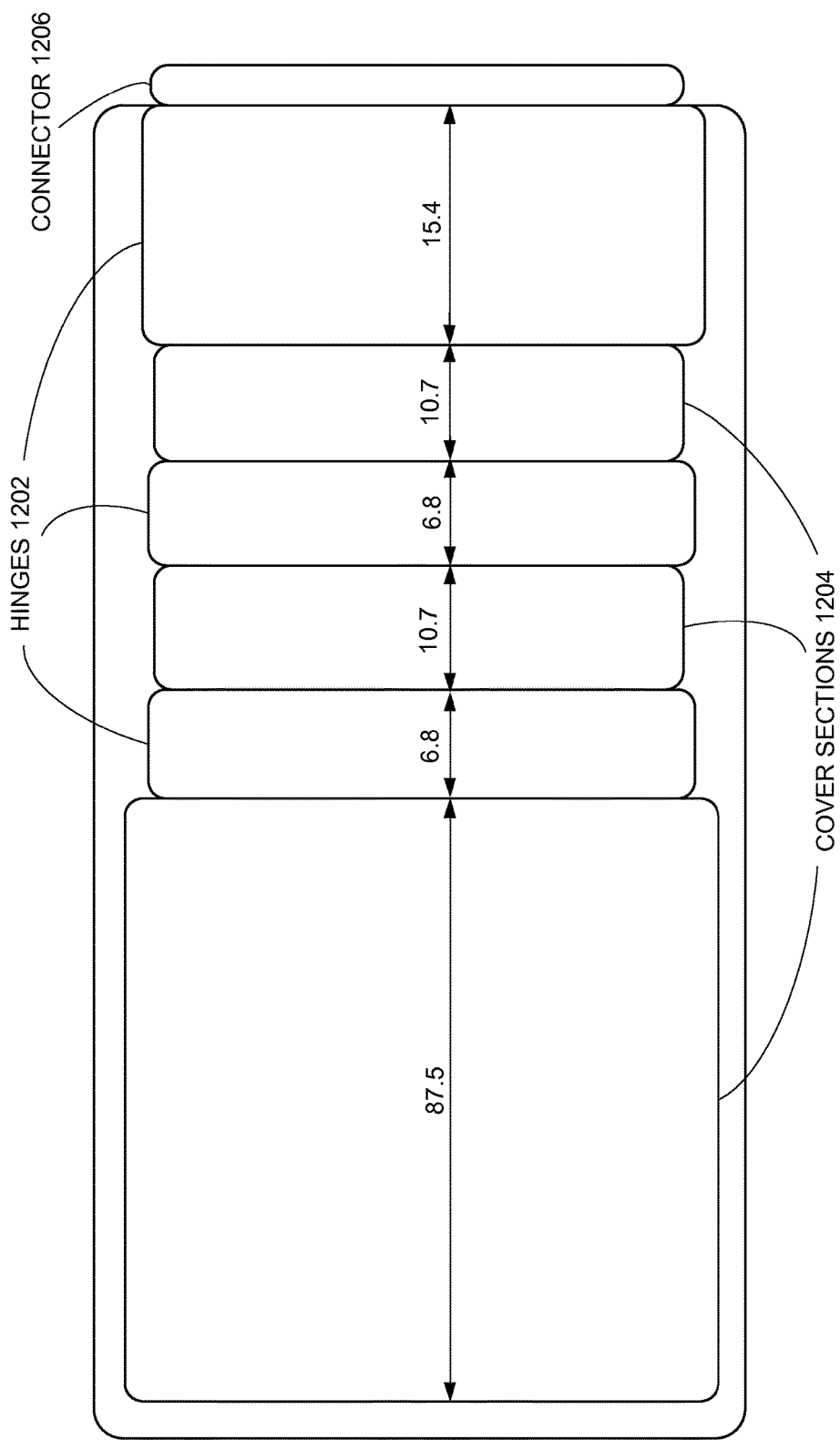
FIG. 12 is an exemplary schematic diagram illustrating an exemplary cover with example widths of the hinges and cover sections.

Referring next to FIG. 12, the cover 402 is shown with exemplary widths of the cover sections 1204 and hinges 1202. For example, two hinges may have a width of approximately 6.8 millimeters. The other hinge may have a width of approximately 15.4 millimeters. Two cover sections may have a width of approximately 10.7 millimeters. The other cover section may have a width of approximately 87.5 millimeters. In some examples where the cover 402 is larger or smaller than shown in FIG. 12 but comprises three cover sections and three hinges, the relative proportions of the cover sections and hinges may be maintained as derived from the exemplary widths shown in FIG. 12.

The examples illustrated and described herein as well as examples not specifically described herein but within the scope of aspects of the invention constitute exemplary means for assembling a cover that facilitates stowage of an object using the cover on a computing device, while enabling a user of the computing device to use the computing device without removing the cover or repositioning the stylus. Some examples include exemplary hinge means disposed substantially parallel to an edge of the computing device to enable the cover to swivel to a back side of the computing device and/or to form a contour around the object to secure the object to the back side of the computing device. For example, as shown in FIG. 10, the hinges 304 are disposed transverse across the cover 402.

The order of execution or performance of the operations in examples of the disclosure illustrated and described herein is not essential, unless otherwise specified. That is, the operations may be performed in any order, unless otherwise specified, and examples of the disclosure may include additional or fewer operations than those disclosed herein. For example, it is contemplated that executing or performing a particular operation before, contemporaneously with, or after another operation is within the scope of aspects of the disclosure.

The term "BLUETOOTH" as used herein refers, in some examples, to a wireless technology standard for exchanging data over short distances using short wavelength radio transmission. The term "NFC" as used herein refers, in some examples, to a short-range high frequency wireless communication technology for the exchange of data over short distances.

When introducing elements of aspects of the disclosure or the examples thereof, the articles "a", "an", "the", and "said" are intended to mean that there are one or more of the elements. The terms "comprising", "including", and "having" are intended to be inclusive and mean that there may be additional elements other than the listed elements. The term "exemplary" is intended to mean "an example of." The phrase "one or more of the following: A, B, and C" means "at least one of A and/or at least one of B and/or at least one of C."

Having described aspects of the disclosure in detail, it will be apparent that modifications and variations are possible without departing from the scope of aspects of the disclosure as defined in the appended claims. As various changes could be made in the above constructions, products, and methods without departing from the scope of aspects of the disclosure, it is intended that all matter contained in the above description and shown in the accompanying drawings shall be interpreted as illustrative and not in a limiting sense.

What is claimed is:

1. A cover comprising:
   three hinges disposed substantially parallel to an edge of the cover, one or more of the three hinges being configurable between a flexible configuration and a rigid configuration;
   a first and second cover section connected by a first hinge of the three hinges;
   a third cover section connected to the second cover section by a second hinge of the three hinges;
   a connector configured to attach the cover to a computing device, the connector connected to the first cover section by a third hinge of the three hinges;
   wherein a combined width of the first cover section and second cover section is less than a width of the third cover section; and
   wherein a width of the third hinge is greater than a width of the first cover section and a width of the second cover section enabling the first cover section and the second cover section to form a contour with the first hinge to accommodate an object located between the first hinge and a side of the computing device.

2. The cover of claim 1, wherein the first cover section has a first width and the second cover section has a second width, the first and second widths being different.

3. The cover of claim 2, wherein the first width is less than the second width.

4. The cover of claim 3, wherein the third hinge has a third width that is greater than the first width.

5. The cover of claim 1, wherein a combined width of the three hinges is greater than the combined width of the first cover section and the second cover section.

6. The cover of claim 1, further comprising a fourth cover section and a fourth hinge, the fourth cover section connected to the third cover section by the fourth hinge.

7. The cover of claim 6, wherein the first and second cover sections have a first width, and the fourth cover section has a second width, the first and second widths being different.

8. The cover of claim 7, wherein the first width is less than the second width.

9. The cover of claim 7, wherein the first width is less than two-thirds of the second width.

10. The cover of claim 1, wherein the first, second, and third hinges are configurable between the flexible configuration and the rigid configuration.

11. A cover comprising:
    three hinges disposed substantially parallel to an edge of the cover, the three hinges being configurable between a flexible configuration and a rigid configuration;
    a first and second cover section connected by a first hinge of the three hinges;
    a third cover section connected to the second cover section by a second hinge of the three hinges;
    a connector configured to attach the cover to a computing device, the connector connected to the first cover section by a third hinge of the three hinges such that the first cover section, the second cover section, and the third cover section are substantially parallel to a surface of the computing device;
    wherein a combined width of the first cover section and second cover section is less than a width of the third cover section; and
    wherein a width of the third hinge is greater than a width of the first cover section and a width of the second cover section enabling the first cover section and the second cover section to form a contour with the first hinge to accommodate an object located between the first hinge and a side of the computing device.

12. The cover of claim 11, wherein the connector is configured to magnetically attach the cover to the computing device.

13. The cover of claim 11, wherein the third hinge has a first width, the first cover section has a second width, and the third cover section has a third width, the first width being greater than the second width and the third width being greater than the first width.

14. The cover of claim 11, wherein the third hinge has a first width, the first cover section has a second width, and the second cover section has a third width, the first width being greater than the second width and the third width being less than the first width.

15. The cover of claim 11, wherein the third hinge has a first width, the first cover section has a second width, and the first and second hinges have a third width, the first width is greater than the second width and the third width is less than the first width.

16. The cover of claim 14, wherein the third cover section has a fourth width, the fourth width is greater than the first, second, and third widths combined.

17. The cover of claim 16, wherein the fourth width is at least two-thirds greater than each of the first, second, and third widths.

18. An automated method for assembling a cover for a computing device, the cover being configured to provide a mechanically stable connection to the computing device, the method comprising:
    providing three hinges disposed substantially parallel to an edge of the cover, one or more of the three hinges being configurable between a flexible configuration and a rigid configuration;
    connecting a first and second cover section using a first hinge of the three hinges;
    connecting a third cover section to the second cover section using a second hinge of the three hinges;
    attaching a connector connected to the first cover section by a third hinge of the three hinges, the connector enabling the cover to attach to a computing device; and wherein a combined width of the first cover section and second cover section is less than a width of the third cover section; and wherein a width of the third hinge is greater than a width of the first cover section and a width of the second cover section enabling the first cover section and the second cover section to form a contour with the first hinge to accommodate an object located between the first hinge and a side of the computing device.

19. The method of claim 18, wherein the first cover section has a first width and the second cover section has a second width, the first and second widths being different.

20. The method of claim 19, wherein the first width is less than the second width.

* * * * *